United States Patent
Chiou et al.

(10) Patent No.: US 10,906,099 B2
(45) Date of Patent: Feb. 2, 2021

(54) PREPARATION METHOD OF HIGH PURITY AND DENSIFIED TUNGSTEN-TITANIUM METAL

(71) Applicant: NATIONAL CHUNG SHAN INSTITUTE OF SCIENCE AND TECHNOLOGY, Taoyuan (TW)

(72) Inventors: Mau-Sheng Chiou, Taoyuan (TW); Chien-Hung Liao, Taoyuan (TW); Chao-Nan Wei, Taoyuan (TW); Hui-Yun Bor, Taoyuan (TW); Kuan-Zong Fung, Taoyuan (TW)

(73) Assignee: NATIONAL CHUNG SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 266 days.

(21) Appl. No.: 16/104,151

(22) Filed: Aug. 17, 2018

(65) Prior Publication Data
US 2019/0193153 A1    Jun. 27, 2019

(30) Foreign Application Priority Data
Dec. 26, 2017   (TW) .............................. 106145599 A

(51) Int. Cl.
  *B22F 3/10*   (2006.01)
  *B22F 9/04*   (2006.01)
  *B22F 1/00*   (2006.01)
  *C23C 16/00*  (2006.01)
  *C22C 1/04*   (2006.01)

(52) U.S. Cl.
  CPC ............ *B22F 3/1003* (2013.01); *B22F 1/007* (2013.01); *B22F 1/0074* (2013.01); *B22F 9/04* (2013.01); *C22C 1/045* (2013.01); *C23C 16/00* (2013.01); *B22F 1/0011* (2013.01); *B22F 2009/043* (2013.01); *B22F 2301/205* (2013.01); *B22F 2304/10* (2013.01); *B22F 2998/10* (2013.01)

(58) Field of Classification Search
  CPC ....... C23C 14/34; C23C 14/3414; C22C 1/04; C22C 1/045; C22C 1/0458; C22C 1/05; C22C 1/051; B22F 1/00; B22F 1/007; B22F 1/0074; B22F 1/0059; B22F 1/0003; B22F 2301/205; B22F 2301/20
  See application file for complete search history.

(56) References Cited

U.S. PATENT DOCUMENTS

| | | | | |
|---|---|---|---|---|
| 5,116,568 A | * | 5/1992 | Sung | ........................ B22F 7/06 419/11 |
| 5,470,527 A | * | 11/1995 | Yamanobe | .......... C23C 14/3414 419/53 |
| 2014/0301891 A1 | * | 10/2014 | Yamamoto | .............. C22C 27/04 420/430 |

FOREIGN PATENT DOCUMENTS

| | | |
|---|---|---|
| CN | 101748365 B | 2/2013 |
| CN | 102366833 B | 3/2014 |
| CN | 103691953 A | 4/2014 |
| CN | 103834923 B | 4/2016 |
| CN | 104611599 B | 1/2017 |
| CN | 104561626 B | 5/2017 |

OTHER PUBLICATIONS

"C.W. Corti, Sintering Aids in Powder Metallurgy, 1986, Platinum Metals Rev., 30, pp. 184-195" (Year: 1986).*
"P.C. Angelo, Metallurgy: Science, Technology and Applications, 2008, PHI Learning Private Limited, pp. 42-45" (Year: 2008).*
"Sigma-Aldrich, Particle Size Conversion, 2008, http://www.sigmaaldrich.com/Area_of_Interest_Ess...esources/Technical_Library/Particle_Size_Conversion.html" (Year: 2008).*
"Yoshinori Nishida, Introduction to Metal Matrix Composites, 2013, Springer, pp. 35-36" (Year: 2013).*

* cited by examiner

Primary Examiner — Jessee R Roe
(74) Attorney, Agent, or Firm — Schmeiser, Olsen & Watts, LLP

(57) ABSTRACT

A preparation method of high purity and densified tungsten-titanium metal which mixes titanium metal powder and tungsten metal powder together; adds metallic nitrates (such as nickel nitrate) as combustion improvers; then taking into the account of the characteristics of metal nitrate, which is soluble in alcohols to form a liquidous precursor, adds metal powder to mix together thoroughly, so that the sintering agent is expected to be colloid and uniformly spread among the tungsten-titanium metal powder. The preparation method significantly reduces the ratio of the combustion improver during the preparation of the high purity and densified tungsten-titanium target material.

7 Claims, 3 Drawing Sheets

PREPARATION METHOD OF HIGH PURITY AND DENSIFIED TUNGSTEN-TITANIUM METAL

CROSS-REFERENCE TO RELATED APPLICATION

This non-provisional application claims priority under 35 U.S.C. § 119(a) on Patent Application No(s). 106145599 filed in Taiwan, R.O.C. on Dec. 26, 2017, the entire contents of which are hereby incorporated by reference.

FIELD OF THE INVENTION

The present invention relates to a preparation method of tungsten-titanium metal, especially, a preparation method of high purity and densified tungsten-titanium metal.

BACKGROUND OF THE INVENTION

The production of semiconductor products of the prior art usually applies the sputtering method to deposit functional thin films. The specifications of sputtering materials mainly include: purity, density, oxygen content, target size, and particle size that all will affect the thin film quality of the later stage. Among all metal target materials, the rare tungsten-titanium (W/Ti, 90/10 wt %) metal target materials have a high atomic mass of tungsten, high corrosion resistance of titanium, excellent adhesive strength of different surfaces, a high melting point, a high density, a low thermal expansion coefficient and a low diffusion coefficient, and can be used in the applications of dense layers that prevent diffusion of atoms from outside. Therefore, the sputtering materials frequently are used for blocking layers and binding layers and widely applied to the field of connecting layers between the solder balls and wafers.

The common preparation methods of target materials are smelting and casting, electron beam smelting, and powder metallurgy, whereas pure metal and alloy target materials are usually prepared by smelting. However, faults, such as segregation of components, heterogeneous micro-structures, and porosity, easily occurs to metal target materials during the smelting process; the faults can not be eliminated even by heat treatment or heat process afterward. During the preparation of the tungsten-titanium metal target material, since the difference between the melting points of tungsten (3422° C.) and titanium (1650° C.) of alloy is huge, it is practically difficult to use the smelting and casting method and to rely on the electron beam smelting equipment to perform smelting (refining) in order to produce the cast ingots of the alloy target material.

In the prior art (CN 101748365 B、CN 102366833 B、CN 103834923 B、CN 103691953 A、CN 104561626 B、CN 104611599 B), the tungsten-titanium metal target material is mostly produced using the "powder metallurgy" method wherein the powder metallurgy utilizes heating compacting process or uses very fine powder in nano-scale to undergo high-pressure pressing. These methods all can achieve the effect of increasing compact and dense. In the actual applications, although adding the sintering agent to enhance the high-temperature dispersion effect is the most convenient and effective method, however adding the sintering agent to the tungsten-titanium alloy metal may lead to a condition of uneven distribution.

Therefore, the current industry urgently needs to develop a type of high purity and densified tungsten-titanium metal target material to be applied to functional thin films of semiconductor products, in order to improve the thin film quality.

SUMMARY OF THE INVENTION

In view of the aforementioned deficiency of the prior art, the main objective of the present invention is to provide a preparation method of high purity and densified tungsten-titanium metal which mixes titanium metal powder and tungsten metal powder together; adds metallic nitrates (such as nickel nitrate) as combustion improvers; then taking into the account of the characteristics of metal nitrate, which is soluble in alcohols to form a liquidous precursor, adds metal powder to mix together thoroughly, so that the sintering agent is expected to be colloid and uniformly spread among the tungsten-titanium metal powder. The preparation method significantly reduces the ratio of the combustion improver during the preparation of the high purity and densified tungsten-titanium target material.

To achieve the aforementioned objective, a solution is developed based on the present invention to provide a preparation method of high purity and densified tungsten-titanium metal wherein the preparation method includes the following steps: (1) mix tungsten-titanium metal powder with one type of metallic nitrates powder to form a powder mixture; (2) mix the powder mixture with a solvent to form powder mixture slurry; (3) apply the ball mill process to the powder mixture slurry to produce a uniform slurry mixture; (4) bake, heat and screen the uniform slurry mixture to form a uniform powder mixture; (5) press the uniform powder mixture into a circular molded body which is sintered by high-temperature heat treatment to form a tungsten-titanium metal target, wherein the tungsten-titanium metal target is made of tungsten-titanium metal with a relative density >99% and a purity level of >99%.

The preparation method of high purity and densified tungsten-titanium metal of the present invention, wherein the materials of metallic nitrate powder are selected from the groups consisting of nickel nitrate, iron nitrate, copper nitrate, and a combination thereof;

the preparation method of high purity and densified tungsten-titanium metal of the present invention, wherein the solvent is an organic solvent;

the preparation method of high purity and densified tungsten-titanium metal of the present invention, wherein the solvent is ethanol;

the preparation method of high purity and densified tungsten-titanium metal of the present invention, wherein the heating temperature in Step 4 is at least 200° C. or higher;

the preparation method of high purity and densified tungsten-titanium metal of the present invention, wherein the sintering temperature of high-temperature heat treatment in Step 5 is at least 1200° C. or higher;

the preparation method of high purity and densified tungsten-titanium metal of the present invention, wherein the screen used in the screening process in Step 4 is a 320-mesh screen;

the preparation method of high purity and densified tungsten-titanium metal of the present invention, wherein the metallic nitrate powder accounts for less than 2% in volume of the powder mixture;

the preparation method of high purity and densified tungsten-titanium metal of the present invention, wherein the metallic nitrate powder accounts for 0.4% in volume of the powder mixture;

the preparation method of high purity and densified tungsten-titanium metal of the present invention, wherein the tungsten-titanium metal target is made of tungsten-titanium metal with the a grain size of 1 to 3 micrometers, nickel content not greater than 230 ppm, and carbon content not greater than 40 ppm.

The aforementioned summary of the invention and the following detail descriptions and drawings are for the purpose of better explaining the novel features, contents, methods, and effect of the present invention in order to achieve the intended objectives. Other objectives and advantages of the present invention will be explained later along with the figures provided.

DETAILED DESCRIPTION OF THE PREFERRED EMBODIMENTS

The technical characteristics of the present invention is explained further by the detailed description given herein below by way of embodiments so that the technical characteristics, advantages, and the effect of the present invention become more fully understood to those skilled in the art to which the present invention described in the patent specification.

Figure 1:
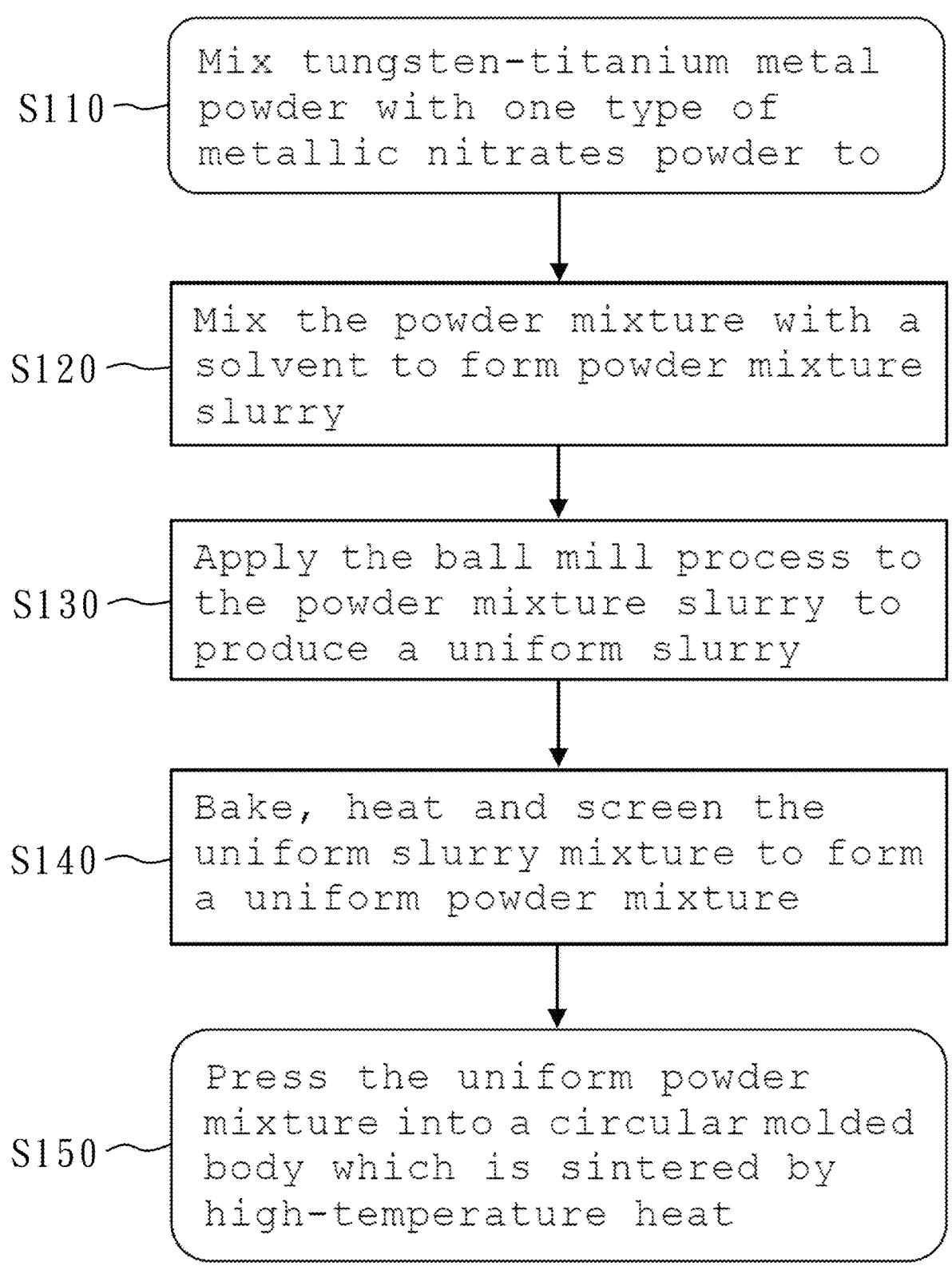
FIG. 1 is the step-by-step schematic diagram of the preparation method of high purity and densified tungsten-titanium metal of the present invention.

Please refer to FIG. 1. As illustrated in FIG. 1, FIG. 1 is the step-by-step schematic diagram of the preparation method of high purity and densified tungsten-titanium metal of the present invention which includes the following steps:

Step(1) S110: Mix tungsten-titanium metal powder with one type of metallic nitrates powder to form a powder mixture;

Step(2) S120: Mix the powder mixture with a solvent to form powder mixture slurry;

Step(3) S130 Apply the ball mill process to the powder mixture slurry to produce a uniform slurry mixture;

Step(4) S140: Bake, heat and screen the uniform slurry mixture to form a uniform powder mixture;

Step(5) S150: Press the uniform powder mixture into a circular molded body which is sintered by high-temperature heat treatment to form a tungsten-titanium metal target, wherein the metallic nitrate powder in Step(1) S110 can account for less than 2% in volume of the powder mixture, preferably, the metallic nitrate powder to account for 0.4% in volume of the powder mixture; the materials of metallic nitrate powder can be nickel nitrate, iron nitrate, or copper nitrate; the solvent in Step(2) S120 can be an organic solvent, preferably, ethanol to be the solvent; the heating temperature in Step(4) S140 can be at least 200° C. or higher and the screen used in the screening process can be a 320-mesh screen (hole diameter of 4.875 micrometers); the sintering temperature of high-temperature heat treatment in Step(5) S150 can be at least 1200° C. or higher.

The present invention takes into the account of the characteristics of metal nitrate, which helps capillary action and dissolution mechanism to take place and improves the condition that tungsten-titanium metal powder in liquid phase and solid phase is difficult to mix uniformly, in order to obtain a high purity and densified tungsten-titanium metal target. The tungsten-titanium metal target is made of tungsten-titanium metal with a relative density >99%, a purity level of >99%, a grain size of 1 to 3 micrometers, nickel content not greater than 230 ppm, and carbon content not greater than 40 ppm.

Figure 2:
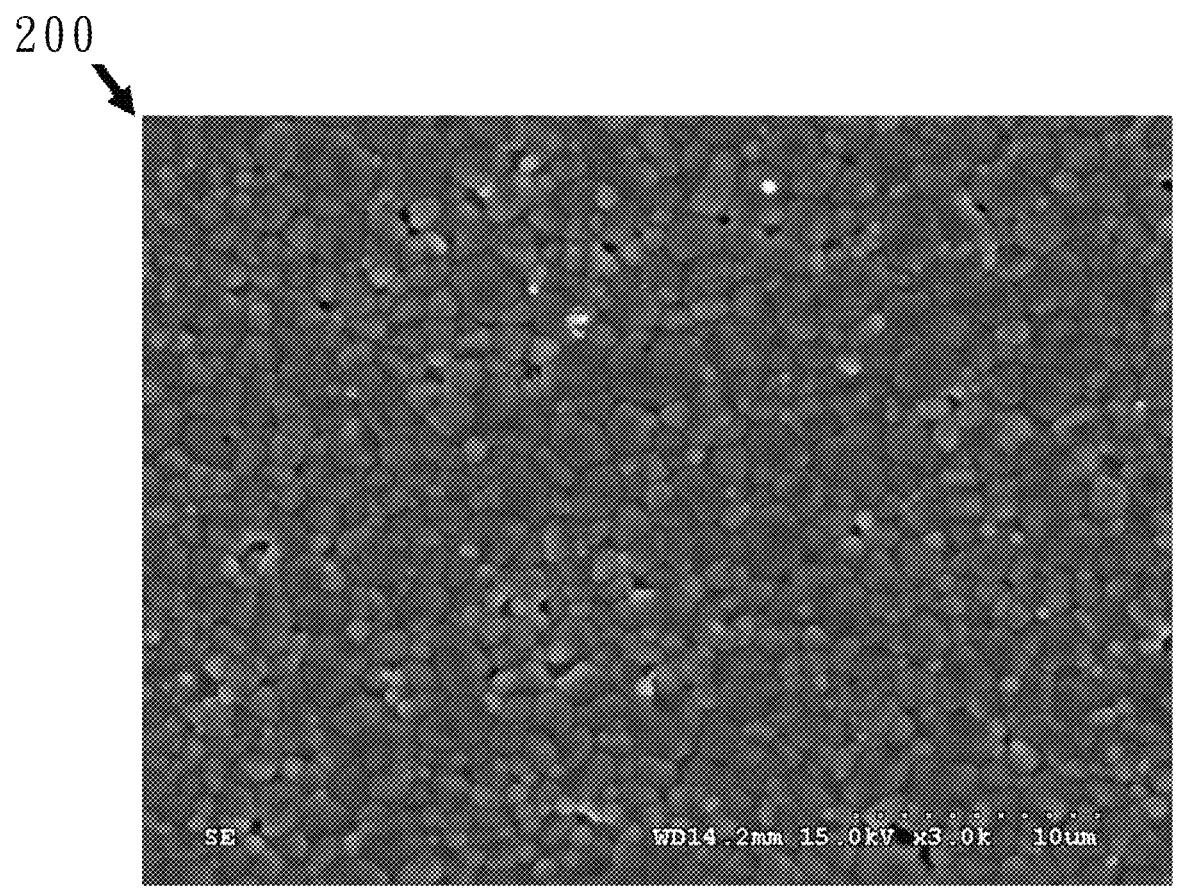
FIG. 2 is an enlarged diagram of the tungsten-titanium metal target of an embodiment of the preparation method of high purity and densified tungsten-titanium metal of the present invention.
Figure 3:
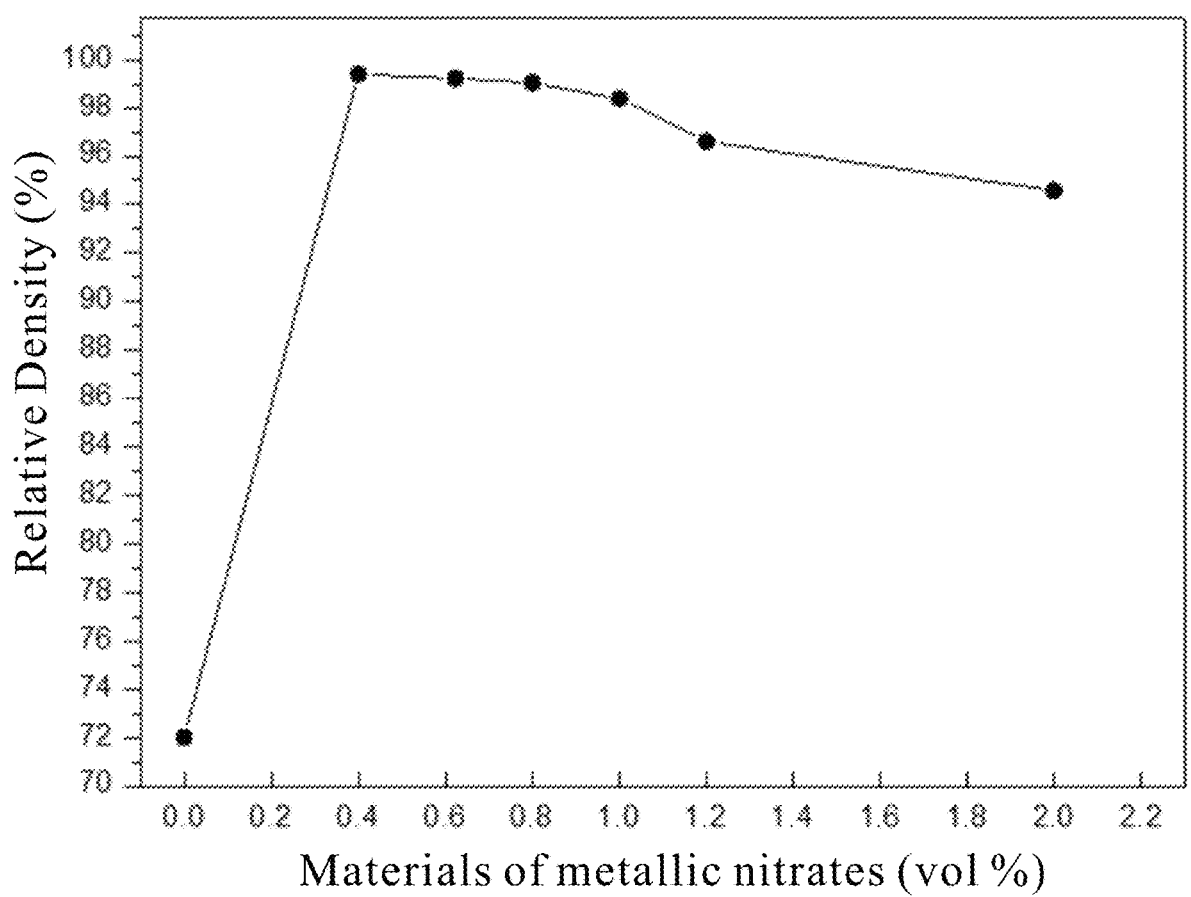
FIG. 3 is a correlation diagram of impact of nickel nitrate on tungsten-titanium metal by volume of nickel nitrate added.

Please refer to FIG. 2. FIG. 2 is an enlarged diagram of the tungsten-titanium metal target of an embodiment of the preparation method of high purity and densified tungsten-titanium metal of the present invention. Nickel nitrate is used as one of the metallic nitrate powder in the embodiment. As shown in the diagram, tungsten-titanium metal can have better relative density by adding nickel nitrate. Please refer to FIG. 3. FIG. 3 is a correlation diagram of impact of nickel nitrate on tungsten-titanium metal by volume of nickel nitrate added. The vertical axis is the relative density of tungsten-titanium metal; the horizontal axis shows the percentage of the metallic nitrate powder in volume accounting for the powder mixture. The metallic nitrate powder used in the embodiment is nickel nitrate, as shown in the diagram. When the volume of nickel nitrate added to the powder mixture increases to 0.4 vol %, the relative density of the tungsten-titanium metal target increases from 72% to higher than 99%. After the sintering process of a high-temperature heat treatment (at a temperature of about 1400° C.), the purity of tungsten-titanium metal target is listed in the table below:

| | Element | | | |
|---|---|---|---|---|
| Concentration | W wt % | Ti wt % | Ni ppm | C ppm |
| WTi target | 90.3 | 9.95 | 230 | 40, | and the enlarged diagram of the tungsten-titanium metal target is shown in FIG. 2. Nickel nitrate is used as one of the metallic nitrate powder in the embodiment. However, the present invention is not limited to this material only. Both nickel nitrate and iron nitrate can achieve the aforementioned effect of the embodiment. When metallic nitrate powder is used as a combustion improver, adding a small amount of nickel nitrate or iron nitrate can achieve the effect of lowering the melting point partially and will not form a proeutectic phase, whereas the effect produced by using copper nitrate is lesser.

Please refer to Step(3) of the preparation method of high purity and densified tungsten-titanium metal of the present invention, wherein the ball mill process can be categorized into dry type and wet type. The dry type ball milling uses a method of smashing and grinding directly; add a proper ratio of grinding beads and powder and apply the centrifugal force to rotate and shake the ball milling container; powder undergoes the process of cold welding, shaping, and cracking repeatedly as the result from bombardment among grinding beads, and the effect of refining powder can be achieved, whereas the wet type ball milling treats the powder of solid phase, which is to be processed, as a solute to be added into a suitable solvent at a proper ratio to produce a suspension liquid; apply force of collision and cutting repeatedly by the motion of mixing and smashing to crack and break apart powder in the solvent, so that the powder is uniformly micronized.

Please refer to Step(5) of the preparation method of high purity and densified tungsten-titanium metal of the present invention, wherein sintering is a process to make metal particles to form a solid mass of material by controlling the process temperature. During the sintering process, the boundary of particles is formed first, resulting in the recrystallization of particles; the high temperature increases the surface formability of metal and establishes a layer of mesh structure of liquid that can improve the nature of mutual mechanical locking and can eliminate all gas dissolved in metal at such a high temperature; the duration of sintering process is about 20 to 40 minutes; during the sintering process, in order to prevent metallic powder from being in contact with atmosphere and becoming oxidized, nitrogen or reducing gas is used to prevent metallic powder from forming an oxidized layer under extreme heat.

The present invention illustrates a method to mix titanium metal powder and tungsten metal powder together; add metallic nitrates (nickel nitrate, iron nitrate, or copper nitrate) as combustion improvers; then taking into the account of the characteristics of metal nitrate, which is soluble in alcohols to form a liquidous precursor, add metal powder to mix together thoroughly, so that the sintering agent is expected to be colloid and uniformly spread among the tungsten-titanium metal powder; the preparation method significantly reduces the ratio of the combustion improver during the preparation of the high purity and densified tungsten-titanium target material thus to improve the thin film quality.

The aforementioned embodiments are chosen and described in order to explain the technological concepts and characteristics of the present invention and are not intended to limit the scope of the present invention in any way. Individuals skilled in the art to can, without departing from the spirit and scope of the present invention, utilize the invention for various modifications as suitable for specific applications. Therefore, the scope of the present invention is defined by the appended claims rather than the foregoing description and the exemplary embodiments described therein.

What is claimed is:

1. A preparation method of high purity and densified tungsten-titanium metal which includes the following steps of:
   (1) mixing a tungsten-titanium metal powder with a nickel nitrate and/or iron nitrate powder to form a powder mixture;
   (2) mixing the powder mixture with a solvent to form a powder mixture slurry;
   (3) applying a ball mill process to the powder mixture slurry to produce a uniform slurry mixture;
   (4) baking, heating and screening the uniform slurry mixture to form a uniform powder mixture;
   (5) pressing the uniform powder mixture into a circular molded body which is sintered by a high-temperature heat treatment to form a tungsten-titanium metal target, where the tungsten-titanium metal target is made of tungsten-titanium metal with a relative density >99% and a purity level of >99%, and wherein the nickel nitrate and/or iron nitrate accounts for 0.4% in volume of the powder mixture.

2. The preparation method of high purity and densified tungsten-titanium metal as claimed in claim 1, wherein the solvent is an organic solvent.

3. The preparation method of high purity and densified tungsten-titanium metal as claimed in claim 2, wherein the solvent is ethanol.

4. The preparation method of high purity and densified tungsten-titanium metal as claimed in claim 1, wherein a heating temperature in Step 4 is at least 200° C. or higher.

5. The preparation method of high purity and densified tungsten-titanium metal as claimed in claim 1, wherein a sintering temperature of the high-temperature heat treatment in Step 5 is at least 1200° C. or higher.

6. The preparation method of high purity and densified tungsten-titanium metal as claimed in claim 1, wherein a screen used in the screening in Step 4 is a 320-mesh screen.

7. The preparation method of high purity and densified tungsten-titanium metal as claimed in claim 1, wherein the tungsten-titanium metal target is made of tungsten-titanium metal with a grain size of 1 to 3 micrometers, nickel content not greater than 230 ppm, and carbon content not greater than 40 ppm.

* * * * *